US007368991B2

(12) United States Patent
Swanson

(10) Patent No.: US 7,368,991 B2
(45) Date of Patent: May 6, 2008

(54) SYSTEM AND METHOD FOR CLAMPING A DIFFERENTIAL AMPLIFIER

(75) Inventor: Leland Scott Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 11/325,843

(22) Filed: Jan. 5, 2006

(65) Prior Publication Data
US 2007/0152753 A1  Jul. 5, 2007

(51) Int. Cl.
*H03F 3/45* (2006.01)
*H03K 5/08* (2006.01)

(52) U.S. Cl. ....................... 330/261; 327/309
(58) Field of Classification Search ............ None
See application file for complete search history.

(56) References Cited
U.S. PATENT DOCUMENTS

| | | | | |
|---|---|---|---|---|
| 5,144,171 A | * | 9/1992 | Huard | 327/54 |
| 5,283,484 A | * | 2/1994 | Brehmer et al. | 327/309 |
| 5,721,504 A | * | 2/1998 | Sato | 327/309 |
| 6,304,141 B1 | * | 10/2001 | Kennedy et al. | 330/253 |
| 6,525,607 B1 | * | 2/2003 | Liu | 330/253 |
| 6,891,408 B2 | * | 5/2005 | Nishizono | 327/103 |
| 6,924,702 B2 | * | 8/2005 | Chen | 330/253 |
| 7,176,731 B2 | * | 2/2007 | Baez et al. | 327/157 |

* cited by examiner

*Primary Examiner*—Robert J. Pascal
*Assistant Examiner*—Krista M Flanagan
(74) *Attorney, Agent, or Firm*—Wade J. Brady, III; Frederick J. Telecky, Jr.

(57) ABSTRACT

System and method for limiting an output signal of a differential amplifier. A preferred embodiment comprises a limit sense amplifier configured to detect when the output exceeds a permitted limit, a common mode bias current unit configured to increase a signal gain of a common mode amplifier in the differential operational amplifier when the limit sense amplifier detects that the output exceeded the permitted limit, and an output stage bias current unit configured to fix the output at a level substantially equal to the specified limit when the limit sense amplifier detects that the output exceeded the permitted limit. The clamping is achieved by changing the operation of circuitry within the differential amplifier and results in a smoother clamping that helps to maintain stable operation.

21 Claims, 3 Drawing Sheets

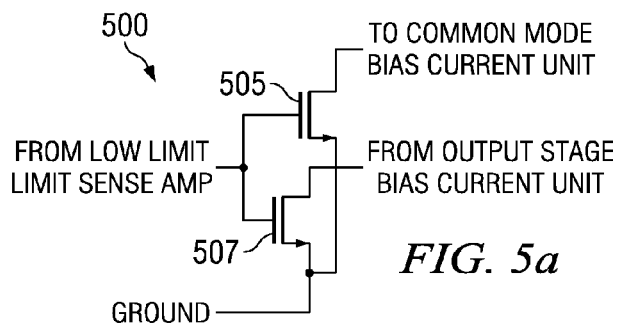

FIG. 5a

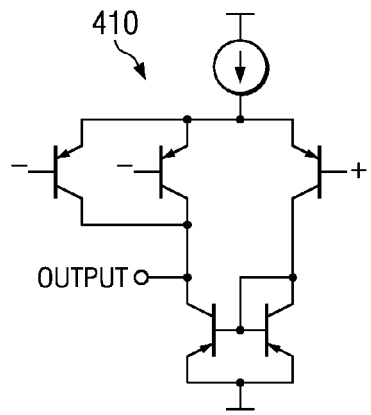

FIG. 5b

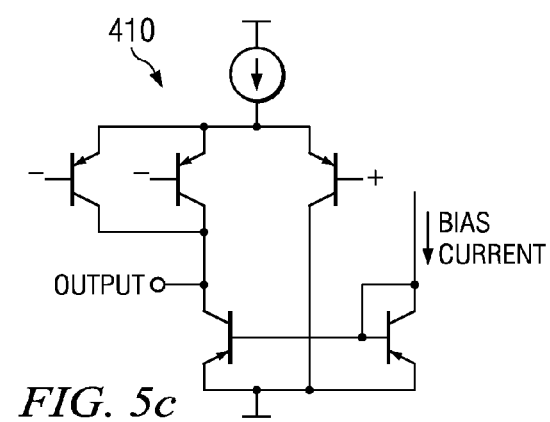

FIG. 5c

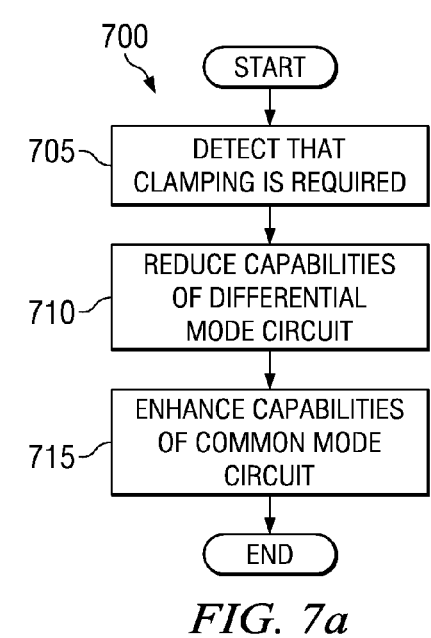

DETECT THAT A FIRST OF TWO SIGNALS IN A DIFFERENTIAL MODE OUTPUT SIGNAL EXCEEDS A PERMITTED LIMIT

FIG. 7c

REDUCE CAPABILITIES OF DIFFERENTIAL MODE CIRCUIT TO FORCE THE FIRST SIGNAL TO REMAIN AT [OR ABOUT] THE PERMITTED LIMIT BY REDUCING CURRENT SINKING OR SOURCING CAPABILITIES

FIG. 7d

ENHANCE CAPABILITIES OF A COMMON MODE CIRCUIT TO FORCE A SECOND SIGNAL OF THE DIFFERENTIAL MODE OUTPUT SIGNAL TO REMAIN AT A VALUE CORRESPONDING TO THE PERMITTED LIMIT

SYSTEM AND METHOD FOR CLAMPING A DIFFERENTIAL AMPLIFIER

TECHNICAL FIELD

The present invention relates generally to a system and method for signal amplification, and more particularly to a system and method for limiting an output signal of a differential amplifier.

BACKGROUND

Amplifiers apply a certain amount of signal gain to an input signal and produce an output signal that is substantially equal to the input signal multiplied by a signal gain if the input signal at an input of the amplifier is within the input specifications of the amplifiers. The signal gain (or simply gain) produced by the amplifiers can be dependent upon amplifier type, operating frequency of the input signal, design decisions made by creators of the amplifiers, and so forth.

Depending upon application, it may not be desirable to have an amplifier produce an output signal that exceeds an expected magnitude. Signals with magnitudes exceeding an expected value can cause surrounding circuitry to not operate properly or may even cause damage to the surrounding circuitry.

Furthermore, a typical amplifier will have a maximum output signal magnitude which it cannot exceed, regardless of the magnitude of the input signal or the gain of the amplifier. The maximum output signal magnitude can be dependent on the device physics of the components used in the amplifier, the design (configuration) of the amplifier, the capabilities of the power supply used to power the amplifier, and so on.

With reference now to FIG. 1, there is shown a diagram illustrating an output signal 100 of an amplifier as a function of time. The output signal 100 of the amplifier can vary with time, depending upon an input signal to the amplifier as well as the amplifier's signal gain. As long as the magnitude of the input signal stays below a maximum magnitude value, the output signal can substantially be a magnified version of the input signal. However, if the magnitude of the input signal exceeds the maximum magnitude value, then the amplifier may not be able to produce an output signal that is simply a magnified version of the input signal. In such situations, the amplifier may simply not have adequate capability to produce the correct output signal corresponding to the input signal.

The diagram shown in FIG. 1 illustrates a situation wherein the output signal 100 tracks an input signal until a point wherein the magnitude of the input signal exceeds the maximum magnitude value (shown in FIG. 1 as line 105, illustrating a magnified version of the maximum input magnitude value). When the magnitude of the input signal exceeds the maximum input magnitude value, the amplifier is not capable of producing a signal at its output that correctly represents the input signal. The amplifier (or circuitry internal (or external) to the amplifier) can limit (clamp) the output signal. The limiting of the output signal can be achieved by limiting either the input signal or the output signal and can be performed very rapidly or gradually. The diagram shown in FIG. 1 illustrates a first limited portion 110 of the output signal that is limited rapidly and a second limited portion 115 of the output signal that is limited gradually. The gradual limiting of the output signal is typically preferred since it helps to reduce the chance of the amplifier becoming unstable.

With reference now to FIG. 2, there is shown a diagram illustrating a technique to limit an output signal of an amplifier 200 by limiting an input signal of the amplifier 200. The amplifier 200 is a differential mode amplifier. The amplifier 200 has two inputs, a first input "A" and a second input "A_bar." A difference between the first input "A" and the second input "A_bar" represents the input signal. Coupled in between the first input "A" and the second input "A_bar" is a transistor 205, preferably a field-effect transistor (FET), with a source terminal of the transistor 205 being coupled to one of the inputs of the amplifier 200 and a drain terminal of the transistor 205 being coupled to the remaining input of the amplifier 200. A gate terminal of the transistor 205 is coupled to an output of a comparator 210 which can be used to compare an output of the amplifier 200 with a reference voltage "VREF." The reference voltage "VREF" can be representative of a maximum output level (or an output level close to the maximum output level) of the amplifier 200. Since the output of the amplifier 200 is also a differential signal, the comparator 210 can compare the reference voltage "VREF" with one of the two signals representing the output of the amplifier 200.

While the output of the amplifier 200 is less than the reference voltage "VREF" the transistor 205 is open and the two inputs of the amplifier 200 are decoupled. However, if the output of the amplifier 200 is equal to or greater than the reference voltage "VREF" the transistor 205 is closed and the two inputs of the amplifier 200 are coupled together and the difference between the first input "A" and the second input "A_bar" is reduced, bringing the input signal below the maximum magnitude value. The transistor 205 can effectively behave like a variable resistor, therefore, the difference between the first input "A" and the second input "A_bar" can be reduced gradually (depending on a difference between the output of the amplifier 200 and the reference voltage "VREF," for example) and produce a gradually limited output signal.

With reference now to FIG. 3, there is shown a diagram illustrating limiting an output signal, wherein the output signal is a differential signal. The diagram shown in FIG. 3 illustrates an output signal comprised of a first signal 305 (shown with a heavy solid black line) and a second signal 310 (shown with a heavy dotted line). The first signal 305 can be thought of as a complement of the second signal 310. If the output signal is centered around zero, then when the first signal 305 is positive valued, then the second signal is negative valued. A pair of dashed lines (dashed line 315 and 320) indicate magnitudes which the output signal should not exceed, either due to maximum signal value limitations of surrounding circuitry or maximum magnitude values of an amplifier used to generate the output signal. When the first signal 305 exceeds the dashed line 315, it is limited and an exemplary limited signal is shown as curve 325. Since the first signal 305 and the second signal 310 are complementary, when the first signal exceeds the dashed line 315, the second signal 310 falls below the dashed line 320 and must also be limited (shown as curve 330).

A prior art technique involves the use of a signal magnitude detecting circuit (or circuits) coupled to a signal output (s) of the amplifier. The signal magnitude detecting circuit can detect when the magnitude of the output signal of the amplifier exceeds the expected magnitude (or a magnitude close to the maximum output magnitude) and when this occurs, the input signal of the amplifier may be clamped to a value so that given the gain of the amplifier, the output signal of the amplifier does not exceed the expected magnitude. The clamping of the input signal can be accomplished by coupling a voltage potential with a given level to the input of the amplifier, for example. The clamping of the input signal can vary from reducing the input signal by just a small amount or reducing the input signal all the way down to zero.

One disadvantage of the prior art is that a sharp change is introduced to the input signal when it is coupled to the voltage potential. The sharp change in the input signal can introduce instability to the amplifier and can result in oscillation and other undesired behavior.

Another disadvantage of the prior art involves where in the amplifier and attendant circuitry the clamping of the input signal occurs. Depending upon where the input signal is clamped, the output signal being fedback may also become clamped.

SUMMARY OF THE INVENTION

These and other problems are generally solved or circumvented, and technical advantages are generally achieved, by preferred embodiments of the present invention which provides a system and method for limiting a magnitude of an output signal of a differential amplifier.

In accordance with a preferred embodiment of the present invention, a method for clamping an output signal of an amplifier is provided. The method includes detecting that clamping of the output signal is needed and reducing the capabilities of a differential mode circuit in the amplifier. The method also includes enhancing the capabilities of a common mode circuit in the amplifier.

In accordance with another preferred embodiment of the present invention, a differential amplifier is provided. The differential amplifier includes a limit sense amplifier that is connected to an output of a differential operational amplifier. The limit sense amplifier detects when the output of the differential operational amplifier exceeds a permitted limit. The differential amplifier also includes a common mode bias current unit that is connected to the differential operational amplifier and the limit sense amplifier. The common mode bias current unit increases a signal gain of a common mode amplifier in the differential operational amplifier when the limit sense amplifier detects that the output of the differential operational amplifier exceeds the permitted limit. The differential amplifier further includes an output stage bias current unit connected to the differential operational amplifier and the limit sense amplifier. The output stage bias unit fixes the output of the differential operational amplifier at a level that is substantially equal to the permitted limit when the limit sense amplifier detects that the output of the differential operational amplifier exceeded the permitted limit.

In accordance with another preferred embodiment of the present invention, a differential amplifier is provided. The differential amplifier includes a means for detecting when an output of a means for differential operational amplifying exceeds a permitted limit, a means for increasing a signal gain of a means for common mode amplifying in the means for differential operational amplifying when the means for detecting determines that the output exceeded the permitted limit. The differential amplifier also includes a means for fixing the output at the permitted limit when the means for detecting determines that the output exceeded the permitted limit.

An advantage of a preferred embodiment of the present invention is that the limiting of the magnitude of the output signal of the differential amplifier is performed gradually to help prevent the differential amplifier from becoming unstable and begin to oscillate.

A further advantage of a preferred embodiment of the present invention is that the performance of circuitry within the differential amplifier is actually enhanced to further help prevent the differential amplifier from becoming unstable.

Yet another advantage of a preferred embodiment of the present invention is that the output of the differential amplifier is limited as opposed to limiting the input signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5a through 5c are diagrams of a low-limit sense amplifier and circuitry attachable to an output of the low-limit sense amplifier, according to a preferred embodiment of the present invention;

FIGS. 7a through 7d are diagrams of sequences of events in the clamping of an output of a differential mode amplifier.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a class AB voltage amplifier within a D differential amplifier system. The invention may also be applied, however, to other classes of differential amplifiers, such as class A, class B, and so forth. The invention also has applicability to other types of amplifiers, such as current amplifiers, as well as transconductance and transresistance amplifiers.

A differential mode amplifier can have circuitry that can be classified into one of two major groups. The circuitry can either be a part of a differential mode circuit or a part of a common mode circuit. The differential mode circuit can be responsible for amplifying the differential mode input signal by the differential mode amplifier's gain, producing the differential mode output signals, ensuring that the differential mode output signals meet differential signaling requirements, and so forth. The common mode circuit may be responsible for ensuring that a common mode signal remains centered between the differential mode signals and so on. The differential mode circuit and the common mode circuit can operate in conjunction with each other to ensure that the differential mode amplifier is operating properly. The differential mode amplifier may have additional circuitry that may be necessary for proper operation, but while these circuits cannot be readily classified as either common mode or differential mode circuits, these circuits can be considered to be necessary glue circuitry and will not be discussed herein.

The differential mode circuit and the common mode circuit, operating in unison, can ensure that the differential mode amplifier is producing a differential mode output signal that is a magnified version of the differential mode input signal. However, when the differential mode input signal is such that the resulting differential mode output signal would exceed a desired maximum magnitude or would cause the differential mode amplifier to clip, the differential mode circuit and the common mode circuit can be adjusted so that the differential mode output of the differential mode amplifier is limited to be approximately equal to (or close to) the desired maximum magnitude or the clipping magnitude.

Figure 1:
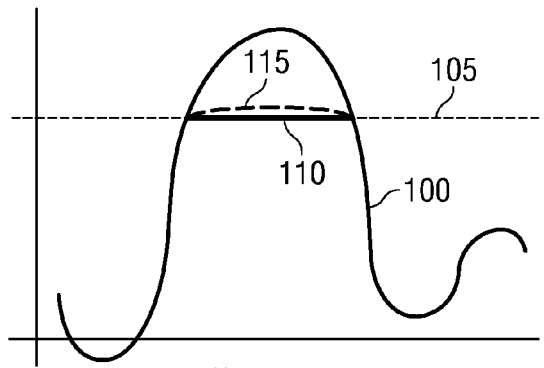
FIG. 1 is a diagram of an output signal of an amplifier as a function of time.
Figure 2:
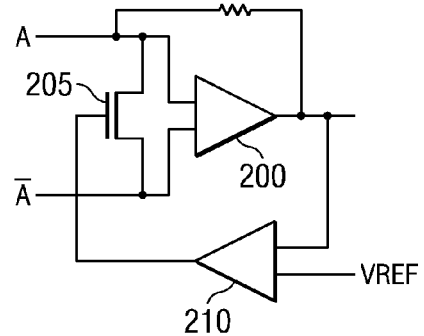
FIG. 2 is a diagram of a technique for clamping an output signal of an amplifier.
Figure 3:
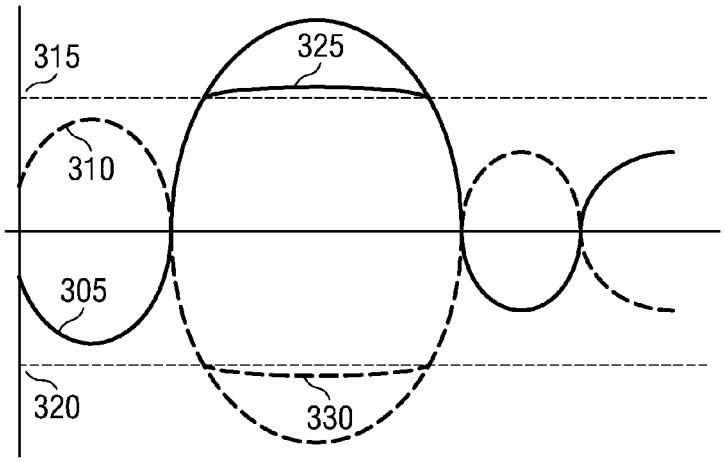
FIG. 3 is a diagram of clamping an output signal.
Figure 4:
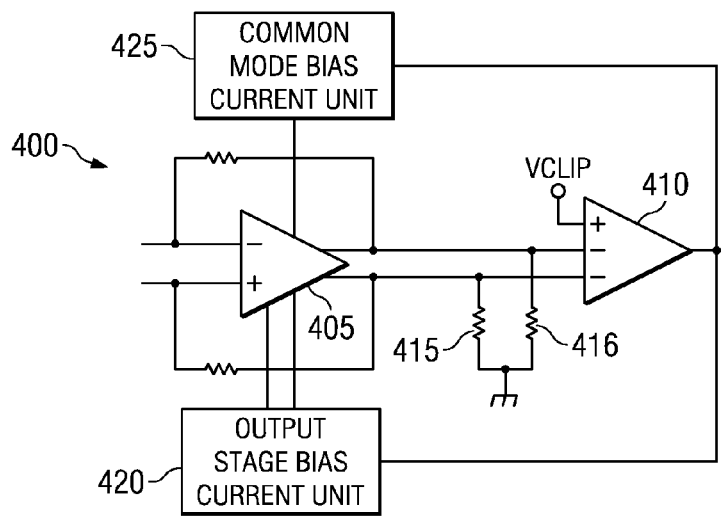
FIG. 4 is a diagram of high level view of a differential mode amplifier, according to a preferred embodiment of the present invention.

With reference now to FIG. 4, there is shown a diagram illustrating a high level view of a differential mode amplifier 400, wherein differential mode circuitry and common mode circuitry within the differential mode amplifier 400 is adjusted to limit the differential mode amplifier 400, according to a preferred embodiment of the present invention. The differential mode amplifier 400 includes a fully differential opamp 405 and a low-limit sense amp 410. The fully differential opamp 405 can provide the actual amplification of a differential input signal, while the low-limit sense amp 410 can be used to detect when a differential output signal of the fully differential opamp 405 exceeds a specified limit. As discussed previously, the specified limit may be a limit that is due to circuitry that is attached to the differential mode amplifier 400 or it may be due to physical limitations of components used in differential mode amplifier 400 as well as the design of the differential mode amplifier 400. Regardless, it is desired that the output of the differential mode amplifier 400 not exceed the specified limit by more than a very small amount.

The fully differential opamp 405 can include a common mode amplifier (not shown) as well as a differential mode amplifier (also not shown). These two amplifiers can be used to limit the output of the differential mode amplifier 400 without significantly altering the performance characteristics of the differential mode amplifier 400, which could lead to the differential mode amplifier 400 becoming unstable and potentially lead to oscillation. Furthermore, the use of the common mode amplifier and the differential mode amplifier within the fully differential opamp 405 to limit the output of the differential mode amplifier 400 can permit a gradual clamping of the output, rather than an abrupt clamping, which can help to maintain stable operation.

The low-limit sense amp 410 can be used to determine when one of the two signals making up the differential mode output of the fully differential opamp 405 exceeds the specified limit. The low-limit sense amp 410 can compare the two signals of the differential mode output of the fully differential opamp 405 with a voltage value "VCLIP" and if one of the signals is less than the voltage value "VCLIP," for example, then the low-limit sense amp 410 can initiate the clamping of the output of the differential mode amplifier 400. For example, if a desired voltage range for the output of the differential mode amplifier 400 is from −2.5 volts to +2.5 volts with a voltage value "VCLIP" of −2.5 volts, then if one of the two signals of the differential mode output of the fully differential opamp 405 drops below −2.5 volts, then the clamping of the output can be initiated. Alternatively, a limit sense amp can compare the two signals of the differential mode output of the differential mode amplifier 400 with a voltage value "VCLIP" of +2.5 and if either exceeds +2.5 volts, the limit sense amp can initiate the clamping of the output. The determination of when to limit the output of the fully differential opamp 405 can occur when one of the signals in the output goes above a high voltage value or goes below a low voltage value. Either can be used to initiate the limiting of the output and the discussion of one does not preclude the other and does not limit the scope or spirit of the present invention.

A pair of resistors (resistor 415 and resistor 416) can be coupled to the two signals of the differential mode output of the fully differential opamp 405 to permit a measurement of current sourced and/or sunk by the fully differential opamp 405 by the low-limit sense amp 410. Actual values of the resistors 415 and 416 can depend upon factors such as fabrication process limits, available substrate area, and so forth.

Output from the low-limit sense amp 410 can be provided to an output stage bias current unit 420 and a common mode bias current unit 425. The input to the output stage bias current unit 420 provided by the low-limit sense amp 410 can be used to alter the biasing on a current source/sink (not shown) that is used to source (or sink) current from a load 415 and 416 coupled to the differential mode amplifier 400. By altering the biasing, it is possible to reduce the current sink from the load and thereby keep the voltage of a first of two signals of the differential mode output of the fully differential opamp 405 at (or near) the specified limit. The signal that is forced to remain at (or near) the specified limit is the signal determined by the low-limit sense amp 410 to have been less than the voltage value "VCLIP."

The input to the common mode bias current unit 425 provided by the low-limit sense amp 410 can be used to alter the biasing on the common mode amplifier (not shown) located within the fully differential opamp 405. One use of the common mode amplifier can be to maintain a constant common mode signal such that the average of the differential mode signal being produced by the fully differential opamp 405 is substantially equal to an externally set value. During the clipping action on the lower signal output, with the first of two signals of the differential mode signal being fixed at (or near) the specified limit by the changing of the biasing of the output current source/sink by the output stage bias current unit 420, a second of two signals of the differential mode signal would be constrained from increasing (and therefore clip) if the common mode portion of the circuit had enough gain. The problem is that usually the common mode gain is insufficient under these conditions, and the second of two signals of the differential mode signal (the high side signal) increases beyond the specified value.

However, by adjusting the bias (and the transconductance, gm) of the common mode amplifier in the fully differential opamp 405, it can be possible to boost the common mode gain to a point where the common mode circuit is capable of limiting the high side output (by itself), and hence, simultaneously maintain the desired constant common mode output level and the output maximum and minimum specs. For example, if the specified limit was −2.5 volts and the complement of the specified limit was +2.5 volts, then the common mode output would be at zero (0) volts. This can be achieved by increasing the gain of the common mode amplifier by adjusting the bias current or tail current of the common mode amplifier. The gain of the common mode amplifier is also commonly referred to as the gm of the common mode amplifier.

There is a separate feedback loop around the common mode circuit. The higher the open loop gain of the common mode circuit, the less the gain error during the extreme conditions present during clipping. With sufficient gain, the common mode value is maintained, even when one of the differential mode outputs is independently clipped. In essence, the common mode circuit is controlling the differential mode amplifier 400 rather than the differential portion during clipping and the second of the two signals is forced to remain at the complement of the specified limit by the value of the first of the two signals relative to the value of the externally set common mode value. A more detailed discussion of the operation of a preferred embodiment of the differential mode amplifier 400 is provided below.

With reference now to FIG. 5a, there is shown a diagram illustrating a circuit 500 that is attached to an output of the low-limit sense amp 410 and allows the adjustment of the output stage bias current unit 420 and the common mode bias current unit 425, according to a preferred embodiment of the present invention. The circuit 500 includes a pair of transistors, transistor 505 and transistor 507. As shown in FIG. 5a, the transistors are N-type metal oxide semiconductor (NMOS) transistors, however, other types of transistors, such as P-type MOS, bipolar junction transistors (BJT), and so forth can be used in their place.

An output from the low-limit sense amp 410 can be coupled to gate terminals of both the transistor 505 and the transistor 507, effectively turning the transistors into switches. The transistor 505 can have a drain terminal coupled to the common mode bias current unit 425 and a source terminal coupled to a circuit common or ground, while the transistor 507 can have a drain terminal coupled to the output stage bias current unit 420 and a source terminal coupled to ground. The transistor 505 is coupled in such a way that the current out of the common mode bias current unit 425 increases as the transistor 505 turns on depending upon a value on the output of the low-limit sense amp 410, and the transistor 507 can be coupled in such a way that current is shunted away from the output stage bias current unit 420 so that the current output from the output stage bias current unit 420 decreases as transistor 507 turns on depending upon a value on the output of the low-limit sense amp 410, and altering the amount of output stage bias current. Transistors with opposite polarity could have their drains and sources interchanged in an alternate preferred embodiment of the present invention.

With reference now to FIGS. 5b and 5c, there are shown diagrams illustrating exemplary low-limit sense amps 410, according to a preferred embodiment of the present invention. The diagrams illustrate designs for low-limit sense amps 410 using BJT transistors. However, other types of transistors can be used to create the low-limit sense amps. The diagram shown in FIG. 5b illustrates a high-gain implementation of the low-limit sense amp 410 while the diagram shown in FIG. 5c illustrates a low-gain implementation of the low-limit sense amp 410. The amount of gain desired in the low-limit sense amp 410 can be dependent upon the application of the differential mode amplifier 400, for example.

Figure 6:
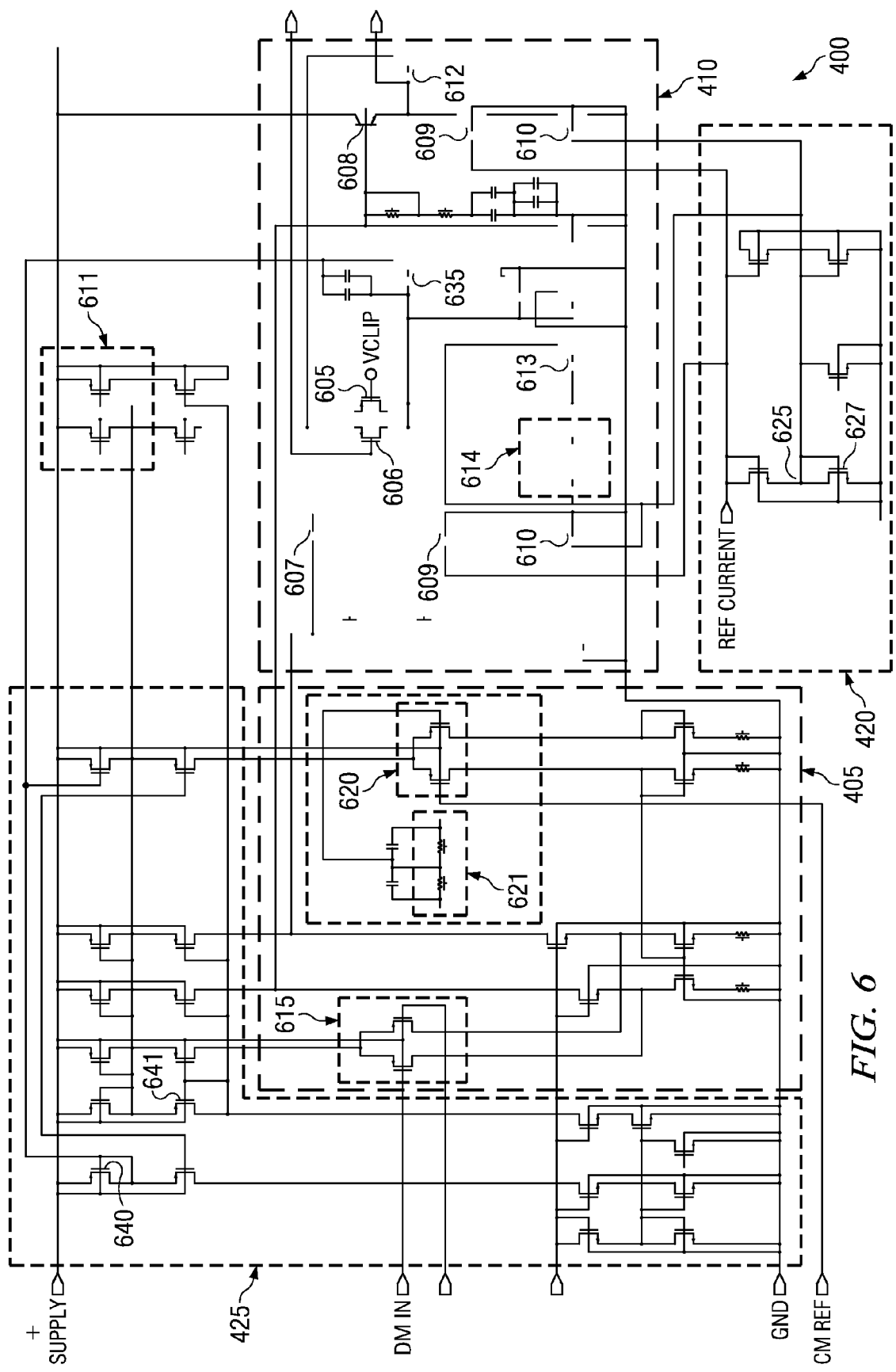
FIG. 6 is a diagram of an exemplary differential mode amplifier, according to a preferred embodiment of the present invention.

With reference now to FIG. 6, there is shown a diagram illustrating a detailed view of an exemplary differential mode amplifier 400, wherein differential mode circuitry and common mode circuitry within the differential mode amplifier 400 is adjusted to limit the differential mode amplifier 400, according to a preferred embodiment of the present invention. The exemplary differential mode amplifier 400 is shown in FIG. 6 as being comprised of NMOS, PMOS, and BJT transistors. However, other combinations of transistors can also be used in creating a differential mode amplifier that is capable of operating in a similar fashion. Therefore, the discussion of the exemplary differential mode amplifier 400 as shown in FIG. 6 should not be construed as being limiting to the scope or spirit of the present invention.

The discussion of the exemplary differential mode amplifier 400 will proceed by discussing the major individual components of the differential mode amplifier as shown in FIG. 4. Although the discussion will entail the specification of preferred transistor types, such as PMOS, NMOS, BJT, NPN, PNP, and so forth, it can be possible to modify the preferred embodiment in such a way that alternate transistor types are used. The discussion should not therefore be construed as being limiting to either the scope or spirit of the present invention. The low-limit sense amp 410 has an input wherein a voltage reference (shown as "VCLIP") can be provided and used as a specified potential in comparisons with the differential mode output of the fully differential opamp 405. The reference voltage "VCLIP" can be coupled to a gate terminal of a transistor 605, preferably a PMOS transistor, while the two signals making up the differential mode output of the fully differential opamp 405 can each be coupled to a base terminal of a transistor, preferably a BJT transistor. A first signal can be coupled to a base terminal of transistor 607 and a second signal can be coupled to a base terminal of transistor 608. Each transistor 607 and 608 can be arranged in an emitter-follower configuration with a pair of transistors arranged serially. For example, transistors 609 and 610 can be coupled to an emitter terminal of the transistor 607. The transistors 609 and 610 can be arranged in what is commonly referred to as current mirror with transistor 609 being a cascode transistor that can be used to improve the performance of transistor 610 as a current mirror, such as its output impedance. The transistor 610 can operate as a current sink and takes current from a load attached to the differential mode amplifier 400. When the differential mode amplifier 400 is to be clamped, the current being mirrored by transistor 610 can be adjusted so that the current removed (being sunk) from the load attached to the differential mode amplifier 400 is reduced.

An alternative embodiment of the present invention is possible wherein the transistors 607 and 608 are arranged in a source-follower configuration instead of an emitter-follower configuration as shown. Basically, there is a desire to arrange the transistors 607 and 608 in a configuration where there is control of the amount of current that is flowing through the transistors 607 and 608. Therefore, it is preferred that the arrangement of the transistors 607 and 608 be configured as class A amplifiers.

Since the fully differential opamp 405 is fully differential, when one output is high, relative to the common mode voltage, the other output is low. When both of the signals of the output of the fully differential opamp 405 are higher than the voltage reference "VCLIP" and no clamping is to occur, then the transistors 606 and 612 are in a cut-off mode. A current mirror 611, functioning as a tail current source, supplies current to source terminal of a transistor 605, 606, and 612 (preferably PMOS transistors). The tail current flows through the transistor 605 and to electrical ground. When one of the signals of the output of the fully differential opamp 405 approaches the voltage reference "VCLIP," for example the signal at the emitter terminal of the transistor 607, then as the emitter terminal goes down, transistor 606 begins to turn on. While this is occurring, the emitter of the transistor 608 is going up and a transistor 612 (preferably a PMOS transistor) remains in a cut-off mode. The tail current is partially flowing through the transistor 606 to a gate terminal of a transistor 613 (preferably an NMOS transistor). When the tail current from the transistor 606 exceeds a current sink provided by a current mirror 614, the tail current will result in an increase in the potential at the drain terminal of the transistor 606 and begins to turn on the transistor 613. Until the tail current from the transistor 606 exceeds the current provided by the current mirror 614, the drain terminal of the transistor 606 is maintained at a relatively constant low voltage level. The transistor 613 can reduce the gate-source voltage of the transistor 610 by diverting current away from the mirror. The currents sunk by 610 are significantly reduced.

A reference current "REF CURRENT" is provided to cascode connected transistors 625 and 627 providing the gate voltages for current mirrors 609 and 610, respectively, as well as 614, which then replicates a multiple of the reference current "REF CURRENT" as current sinks in the low-limit sense amp 405, and at the emitters of transistors 607 and 608. When not operating in a clamping mode, the voltage at the gate of transistor 610 is a function of the magnitude of "REF CURRENT" and the size and characteristics of transistor 627. The current "REF CURRENT" will then be mirrored as a current that is scaled up or down according to the relative sizes of 610 and 627. The current through the cascode 609 and 610 will sink a current from the load attached to the differential mode amplifier 400 that is substantially equal to (or a multiple of) the reference current "REF CURRENT." When operating in a clamping mode, a transistor 613 begins to shunt a current that would normally be going through the drain terminal of the transistor 627. This thereby reduces the gate-source voltage of the transistor 627 and 610. This results in a throttling of the current being sunk through the current sinks (transistors 610). With the input of the low-limit sense amp 410 at a given level, the current sinks (transistors 610) can either sink current from the transistors 607 and 608 or the load connected to the differential mode amplifier 400. If there is no load connected to the differential mode amplifier 400, then all of the current being sunk is passed through the transistors 607 and 608. If the differential mode amplifier 400 is being clamped, then the current sink is being throttled back and the transistors 607 and 608 are being asked to provide less current.

The fully differential opamp 405 features a differential mode amplifier 615 and a common mode amplifier 620. A resistor/capacitor network 621 provides a load to the output of the differential mode amplifier 400 as well as an averaging of the differential mode signal. An input of the common mode amplifier 620 can be coupled to a common mode reference voltage "CM REF" and compares the average of the differential mode signal (provided by the resistor/capacitor network 621) to the common mode reference voltage "CM REF." The common mode amplifier 400 will then make any adjustments that it is capable of performing to make sure that the two are substantially equal.

When the current sinks (transistors 610) are throttled back by transistor 613, the gate voltage of transistor 635 (preferably an NMOS transistor) with a drain that is coupled to a current mirror 640 is increasing. When in a clamping mode, the gate of the transistor 635 starts to go up and the transistor 635 turns on and sinks additional current through the reference portion of mirror 640. This will result in a pull down of a gate of the current mirror 640, the current mirror 640 is turned on more and it provides more current. This effectively increases the tail current in the common mode amplifier 620 and boosts the gain (transconductance, gm) of the common mode amplifier 620. The increased gain of the common mode amplifier 620 exceeds the gain of the differential mode amplifier 615 and forces the common mode signal to remain constant. This in turn forces the second signal of the differential mode signal (the signal not being directly clamped by the low-limit sense amp 410) to remain constant and at the same level above "CM REF" as "VCLIP" is below, even as it desires to increase.

The output stage bias current unit 420 includes the reference pair portion of current mirrors that can be use to replicate the reference current "REF CURRENT" as an amount of current to be sunk from either the transistors 607 and 608 and/or the load attached to the differential mode amplifier 400. The common mode bias current unit 425 provides a plurality of current mirrors, such as current mirrors 640 and 641 to provide adequate tail current to permit the common mode amplifier 620 to overpower the differential mode amplifier 615 and maintain the value of the common mode signal substantially constant while preventing the differential mode amplifier 615 from changing the second signal of the differential mode output.

With reference now to FIG. 7a, there is shown a diagram illustrating a sequence of events 700 in the clamping of a differential mode output signal of a differential mode amplifier, wherein the clamping of the differential mode output signal is achieved by making use of differential mode and common mode circuitry within the differential mode amplifier, according to a preferred embodiment of the present invention. When the differential mode amplifier 400 is operating with input signals that do not result in corresponding output signals exceeding a permitted limit, no clamping of the differential mode output signal is required. The sequence of events 700 can begin when it is detected that clamping is required (block 705). Clamping of the differential mode amplifier 400 is required when the differential mode output signal produced by the differential mode amplifier 400 exceeds the permitted limit, with the permitted limit being set based upon maximum signal magnitudes set by circuitry attached to the differential mode amplifier 400 or by components and/or devices used in the differential mode amplifier 400.

While the discussion of the operation of the differential mode amplifier has focused upon an amplifier that controls an output voltage by controlling an output current, it is also possible to control the output current by controlling an output current, e.g., preventing the output current from exceeding the permitted limit by directly measuring the output current and comparing it to a reference level rather than measuring and comparing the output voltage. Additionally, the discussion has focused on voltage amplifiers, but the present invention can be applied to current amplifiers, as well as transconductance and transresistance amplifiers.

With reference to FIG. 7b, the detection that clamping is required can be accomplished by comparing the two signals making up the differential mode output signal with the permitted limit. If the magnitude of either of the two signals exceeds the permitted limit, then clamping is required. A low-limit sense amp, such as the low-limit sense amp 410 (FIG. 4), can be used to compare the two signals of the differential mode output signal with the permitted limit, for example. Alternatively, rather than comparing a magnitude of the two signals of the differential mode output signal with the permitted limit, it may be possible to compare the actual value of the signals with the permitted limit. For example, if the permitted limit is −2.5 volts, the two signals can be compared against a reference voltage equal to −2.5 volts and if either of the two signals attain a value of less than −2.5 volts, then clamping is required.

With reference back to FIG. 7a, once it is determined that clamping is required (block 705), the capabilities of differential mode circuitry in the differential mode amplifier 400 can be reduced (block 710). The reduction of the capabilities of the differential mode circuitry may be used to fix a first of the two signals of the differential mode output signal at (or near) the permitted limit. With reference to FIG. 7c, the reduction of the differential mode circuitry's capabilities may be accomplished by reducing the circuitry's ability to sink current. For a given load attached to the differential mode amplifier 400, a reduction in the ability to sink current can net a reduction in the voltage dropped over the load. Therefore, if the ability to sink current is reduced according to a difference between the permitted limit and the first of two signals of the differential mode output signal, the first of two signals can remain at (or near) the permitted limit. Alternatively, the reduction of the differential mode circuitry's capabilities may be accomplished by reducing the circuitry's ability to source current.

With reference back to FIG. 7a, after reducing the capabilities of the differential mode circuitry (block 710) and effectively fixing one of the two signals of the differential mode output signal at (or near) the permitted limit, it is still necessary fix a second of the two signals of the differential mode output signal. To fix the second of the two signals at (or near) a value that corresponds to the permitted limit, it is necessary to enhance the capabilities of common mode circuitry in the differential mode amplifier (block 715). For example, if the permitted limit is −2.5 volts, the desired common mode signal value is zero (0) volts, and the first signal is fixed at −2.5 volts, then the second signal will need to be at +2.5 volts to meet the desired common mode signal value. Therefore, by enhancing the common mode circuitry's capabilities, it is possible to fix the second signal's value based on the first signal's value and the desired common mode signal value.

With reference now to FIG. 7d, the enhancing of the capabilities of the common mode circuitry can entail increasing the common mode circuitry's gain (gm). This can be accomplished by increasing a tail current that flows through the common mode circuitry. One technique for increasing the tail current through the common mode circuitry is described previously in the discussion of FIG. 6. Once the gain of the common mode circuitry is increased, the fixed first signal of the differential mode output of the differential mode amplifier and the desired common mode signal value are used to fix the second signal of the differential mode output of the differential mode amplifier. The clamping can continue as long as the input signal to the differential mode amplifier results in an output signal that exceeds the permitted limit. Once the input signal does not result in an output signal that exceeds the permitted limit, then the clamping can stop. The clamping of the output signal by modifying the performance of the circuitry within the differential mode amplifier rather than the input signal can result in a gradual clamping that can help increase the stability of the differential mode amplifier and reduce the chance of oscillation and ringing.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for clamping an output signal of an amplifier, the method comprising:
   detecting that clamping is required;
   reducing capabilities of a differential mode circuit in the amplifier; and
   enhancing capabilities of a common mode circuit in the amplifier.

2. The method of claim 1, wherein the detecting comprises:
   comparing the output signal with a permitted limit; and
   determining that clamping is required if the output signal exceeds the permitted limit.

3. The method of claim 2, wherein the output signal is a differential mode signal with two distinct signals, wherein the comparing comprises comparing both signals in the differential mode signal with the permitted signal, and wherein the determining that clamping is required if either signal exceeds the permitted limit.

4. The method of claim 1, wherein the comparing involves comparing absolute values of the output signal and the permitted limit.

5. The method of claim 1, wherein the reducing comprises reducing the differential mode circuit's ability to source or sink current.

6. The method of claim 5, wherein the reducing is proportional to a difference between the output signal and a permitted limit.

7. The method of claim 1, wherein the enhancing comprises enhancing the common mode circuit's gain.

8. The method of claim 7, wherein the enhancing comprises increasing a tail current through the common mode circuit.

9. The method of claim 7, wherein the output signal is a differential mode signal with two distinct signals, wherein the reducing fixes a first of the two distinct signals at a value substantially equal to a permitted limit, and wherein increasing the common mode circuit's gain enables the common mode circuit to overpower the differential mode circuit and set a value of a second of the two distinct signals based upon the value of the first of the two distinct signals and a common mode signal value.

10. A differential amplifier comprising:
- a limit sense amplifier coupled to an output of a differential operational amplifier, the limit sense amplifier configured to detect when the output of the differential operational amplifier exceeds a permitted limit;
- a common mode bias current unit coupled to the differential operational amplifier and the limit sense amplifier, the common mode bias current unit configured to increase a signal gain of a common mode amplifier in the differential operational amplifier when the limit sense amplifier detects that the output of the differential operational amplifier exceeded the permitted limit; and
- an output stage bias current unit coupled to the differential operational amplifier and the limit sense amplifier, the output stage bias current unit configured to fix the output of the differential operational amplifier at a level substantially equal to the permitted limit when the limit sense amplifier detects that the output of the differential operational amplifier exceeded the permitted limit.

11. The differential amplifier of claim 10, wherein the output of the differential amplifier is a differential mode signal with two signals, wherein the limit sense amplifier detects when one of the two signals exceeds the permitted limit.

12. The differential amplifier of claim 10, wherein the common mode bias current unit increases the signal gain of the common mode amplifier by increasing a tail current flowing through the common mode amplifier.

13. The differential amplifier of claim 10, wherein the output of the differential amplifier is a differential mode signal with two signals, wherein a first of the two signals is fixed to a value substantially equal to the permitted limit, and wherein the increased signal gain of the common mode amplifier allows the common mode amplifier to overpower a differential mode amplifier in the differential amplifier and set the value of a second of the two signals to be substantially equal to a value corresponding to the permitted limit.

14. The differential amplifier of claim 10, wherein the output stage bias current unit reduces a current sourcing or sinking capability of the differential operational amplifier.

15. The differential amplifier of claim 14, wherein the reduction of the current sourcing or sinking capability of the differential operational amplifier is proportional to a difference between the output signal and the permitted limit.

16. The differential amplifier of claim 15, wherein the output of the differential amplifier is a differential mode signal with two signals, wherein the reduction of the current sourcing or sinking capability of the differential operational amplifier fixes a first of the two signals in the output of the differential amplifier to a value substantially equal to the permitted limit, wherein the first of two signals exceeded the permitted limit.

17. The differential amplifier of claim 10, wherein the output comprises a class A amplifier stage arranged in an emitter-follower or source-follower configuration.

18. The differential amplifier of claim 10, wherein the differential amplifier is a voltage amplifier.

19. A differential amplifier comprising:
- a means for detecting when an output of a means for differential operational amplifying exceeds a permitted limit;
- a means for increasing a signal gain of a means for common mode amplifying in the means for differential operational amplifying when the means for detecting determines that the output exceeded the permitted limit; and
- a means for fixing the output at the permitted limit when the means for detecting determines that the output exceeded the permitted limit.

20. The differential amplifier of claim 19, wherein the means for detecting compares the output with the permitted limit.

21. The differential amplifier of claim 19, wherein the means for increasing increases a tail current flowing through the common mode amplifier means and wherein the means for fixing reduces a current sinking or sourcing ability of the means for differential operational amplifying.

* * * * *